(12) United States Patent
Chang et al.

(10) Patent No.: US 6,174,367 B1
(45) Date of Patent: Jan. 16, 2001

(54) EPITAXIAL SYSTEM

(75) Inventors: Chun-Yen Chang; Shih-Hciung Chan; Jian-Shihn Tsang; Jan-Dar Guo; Wei-Chi Lai, all of Hsinchu (TW)

(73) Assignee: National Science Council (TW)

( * ) Notice: Under 35 U.S.C. 154(b), the term of this patent shall be extended for 0 days.

(21) Appl. No.: 09/246,327

(22) Filed: Feb. 9, 1999

(30) Foreign Application Priority Data

Feb. 23, 1998 (TW) .................................................. 87102573

(51) Int. Cl.[7] ............................ C23C 16/34; C30B 35/00
(52) U.S. Cl. ...................................... 117/200; 118/723 R
(58) Field of Search ................................ 117/103, 200; 118/723 R

(56) References Cited

U.S. PATENT DOCUMENTS

| | | | |
|---|---|---|---|
| 3,916,034 | * 10/1975 | Tsuchimoto | 427/38 |
| 4,421,592 | * 12/1983 | Shuskus | 156/613 |
| 4,659,401 | * 4/1987 | Reif et al. | 148/175 |
| 4,870,030 | * 9/1989 | Markunas et al. | 437/81 |
| 5,210,051 | * 5/1993 | Carter, Jr. | 437/107 |
| 5,593,741 | * 1/1997 | Ikeda | 427/579 |
| 5,637,146 | * 6/1997 | Chyi | 117/200 |
| 5,900,056 | * 5/1999 | Choi et al. | 117/104 |

FOREIGN PATENT DOCUMENTS

| | | | |
|---|---|---|---|
| 4-26597 | * 1/1992 | (JP) | C30B/29/40 |
| 11-87253 | * 3/1999 | (JP) | H01L/21/205 |

\* cited by examiner

*Primary Examiner*—Benjamin L. Utech
*Assistant Examiner*—Matthew Anderson

(57) ABSTRACT

An epitaxial system is provided for performing an epitaxial growth of IIIA-VA compound on the wafer substrate. The epitaxial system includes a first reaction region for providing a plasma of a first reactant, a second reaction region for epitaxially reacting the plasma of the first reactant with a second reactant on a wafer, and a guiding medium disposed between the first reaction region and the second reaction region for passing therethrough the second reactant and the first reactant plasma to the second reaction region.

12 Claims, 6 Drawing Sheets

EPITAXIAL SYSTEM

FIELD OF THE INVENTION

The present invention is related to an epitaxial system, and especially to an organometallic vapor-phase epitaxial system.

BACKGROUND OF THE INVENTION

A general organometallic vapor-phase epitaxial system is commonly used for the growth of IIIA-VA compounds. For a nitride epitaxy, it is required to use ammonia as a reaction source of nitrogen. However, ammonia is reactive only under high temperature. As the growth temperature is increased, the demand for the saturated vapor pressure of nitrogen for the growth of gallium nitride is increased. It brings about an increased depletion of ammonia but the effective reaction amount of nitrogen does not increase. In addition, the epitaxial system using ammonia has some disadvantages as follows:

1. During the growth of P-type III-V compound, the coverage by hydrogen is occurred, resulting in that P-type III-V compound is under a high isolated state. Therefore, it needs another treatment for recovering the P-type electrical conductivity.
2. Ammonia easily causes a comsumption of graphite and vacuum-required oil, and a damage of the vacuum tube and the system so that it is an uneasy task to maintain the system.

In another organometallic vapor-phase epitaxial system using the electron cyclotron resonance (ECR), IIIA and VA elements are provided from different tubes and then react with each other to produce an epitaxial growth on the surface of the wafer substrate. However, it still has some defects:

1. After the VA elements leave the electron cyclotron resonance, they will easily return to the molecule state (e.g. $N_2$). Therefore, the effective amount for forming the IIIA-VA compound is quite less than its consumed amount of the initial reactant.
2. The wafer substrate can not be heated to a higher temperature so that the crytallization of the epitaxial layer is not good enough.

Therefore, it is desirable to develop a device or method to solve the problems encountered by the applicant.

SUMMARY OF THE INVENTION

An object of the present invention is to provide an epitaxial system adapted to be used for performing an epitaxial growth of IIIA-VA compound on the wafer substrate.

According to the present invention, the epitaxial system includes a first reaction region for providing a plasma of a first reactant, a second reaction region for epitaxially reacting the plasma of the first reactant with a second reactant on a wafer, and a guiding medium disposed between the first reaction region and the second reaction region for passing therethrough the second reactant and the first reactant plasma to the second reaction region.

In accordance with one aspect of the present invention, the first reaction region includes a high radiation frequency plasma generator.

In accordance with another aspect of the present invention, the first reactant is a substance containing one of VA elements.

In accordance with another aspect of the present invention, the first reactant is one selected from a group consisting of ammonia, nitrogen, arsenic, arsine ($AsH_3$), phosphorus, phosphorus trihydride ($PH_3$) and a mixture thereof.

In accordance with another aspect of the present invention, the second reaction region includes a medium radiation frequency heater for controlling a temperature of the wafer ranged from room temperature to 1200° C.

In accordance with another aspect of the present invention, the second reactant is one selected from a group consisting of IIIA organometallic compounds.

In accordance with another aspect of the present invention, the second reactant is a gallium-containing compound.

In accordance with another aspect of the present invention, the guiding medium is a multi-hole tube.

In accordance with another aspect of the present invention, the multi-hole tube is disposed between the first reaction region and the second reaction region in a horizontal arrangement.

In accordance with another aspect of the present invention, the epitaxial system further includes a gas container to provide a carrier gas for carring the first reactant and the second reactant.

In accordance with another aspect of the present invention, the epitaxial system further includes a gas flow controller for controlling flow rates of the first reactant, the second reactant, and the carrier gas.

In accordance with another aspect of the present invention, the epitaxial system further includes an electronic pressure controller to control the gas flow controller.

In accordance with another aspect of the present invention, the epitaxial system further includes a vacuum pumping system controlled by the electronic pressure controller for adjusting a pressure of the epitaxial system.

The present invention may best be understood through the following description with reference to the accompanying drawings, in which:

DETAILED DESCRIPTION OF THE PREFERRED EMBODIMENT

Figure 1:
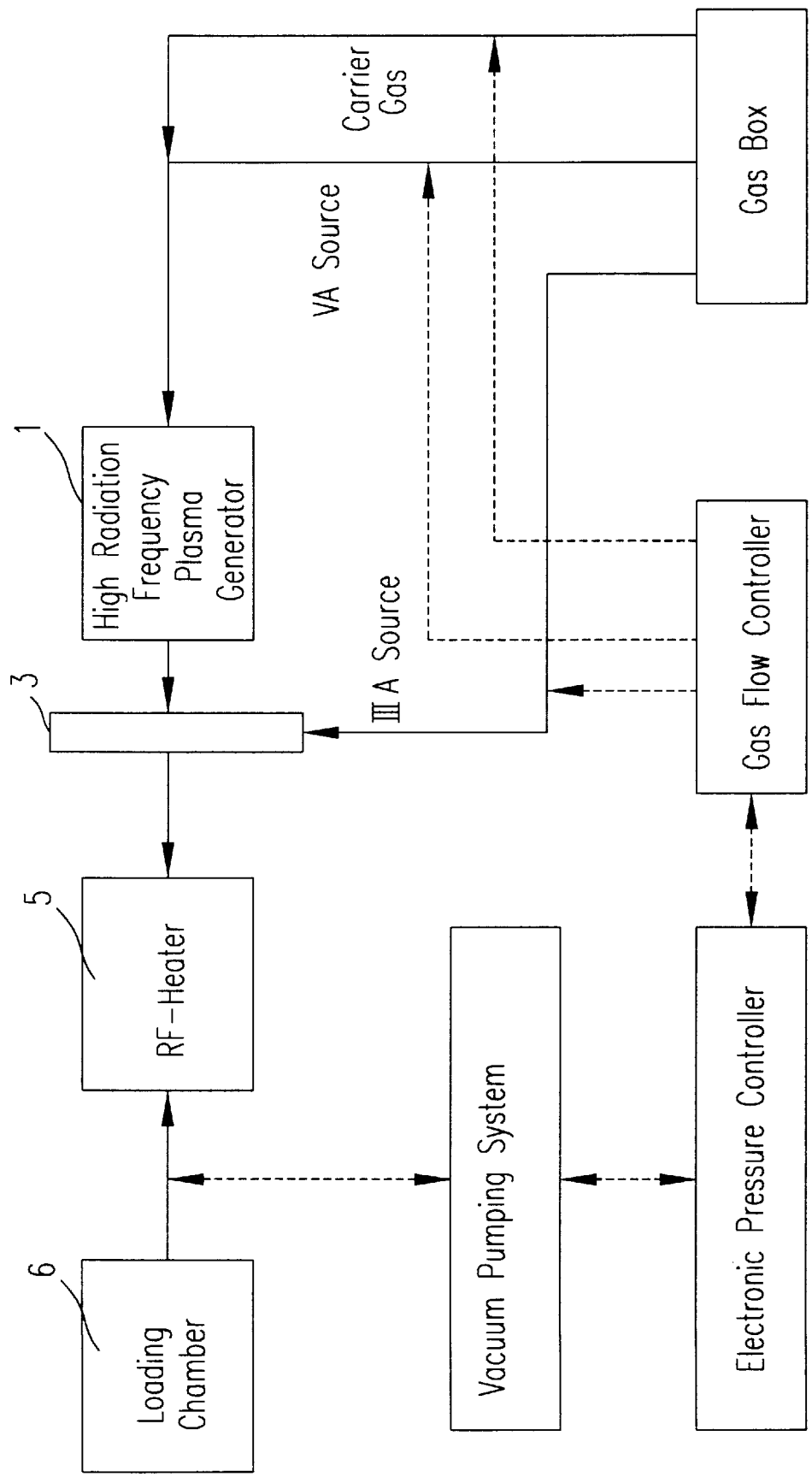
FIG. 1 is a simple diagram showing an epitaxial system according to the present invention.

Please refer to FIG. 1 showing an epitaxial system which is adapted to use for the epitaxial growth of IIIA-VA compound semiconductor according to the present invention. The epitaxial system includes a first reaction region, a second region, and a guiding medium. The first reaction region includes a high radiation frequency plasma generator 1 for providing a plasma of a first reactant. The first reactant is a substance containing one of VA elements, for example, ammonia, nitrogen, arsenic, arsine ($AsH_3$), phosphorus, phosphorus trihydride ($PH_3$) or a mixture thereof. Preferably, the first reactant is nitrogen because it has the advantages of low price, high security, and no contamination.

The second reaction region includes a medium radiation frequency heater (RF-heater) 5 for reacting the plasma of the first reactant with a second reactant on a wafer to produce an epitaxy. The medium radiation frequency heater 5 can effectively control the temperature of the wafer ranged from room temperature to 1200° C. The second reactant is one of IIIA organometallic compounds, preferably a gallium-containing compound such as trimethylgallium (TEGa).

The guiding medium is a multi-hole tube 3 which is disposed between the plasma generator 1 and the RF-heater 5 for passing therethrough the second reactant and the first reactant plasma to the RF-heater 5.

The epitaxial system further includes a gas container (or a gas box) containing a carrier gas, the first reactant and the second reactant. Under the control of a gas flow controller, the first reactant can pass through the multi-hole tube 3 with the assistance of the carrier gas. The epitaxial system further includes an electronic pressure controller to control the gas flow controller. The epitaxial system further includes a vacuum pumping system controlled by the electronic pressure controller for adjusting a pressure of the epitaxial system. In addition, the wafer substrate waiting for executing an epitaxial growth is put on the loading chamber 6 in advance and then is tranferred to the medium radiation frequency heater 5.

According to the present invention, the multi-hole tube 3 is disposed between the plasma generator 1 and the RF-heater 5 in a horizontal arrangement. The first reactant enters the medium radiation frequency heater 5 through the plasma generator 1 and the multi-hole tube 3. The second reactant enters the medium radiation frequency heater through the multi-hole tube 3 directly. Due to the relative position between the multi-hole tube 3 and the plasma generator 1, the excited nitrogen will not return to the stable state. This way can significantly improve the efficiency of the epitaxial growth and only needs a cheap and simple high radiation frequency plasma generator instead of the expensive electron cyclotron resonance (ECR).

Figure 2:
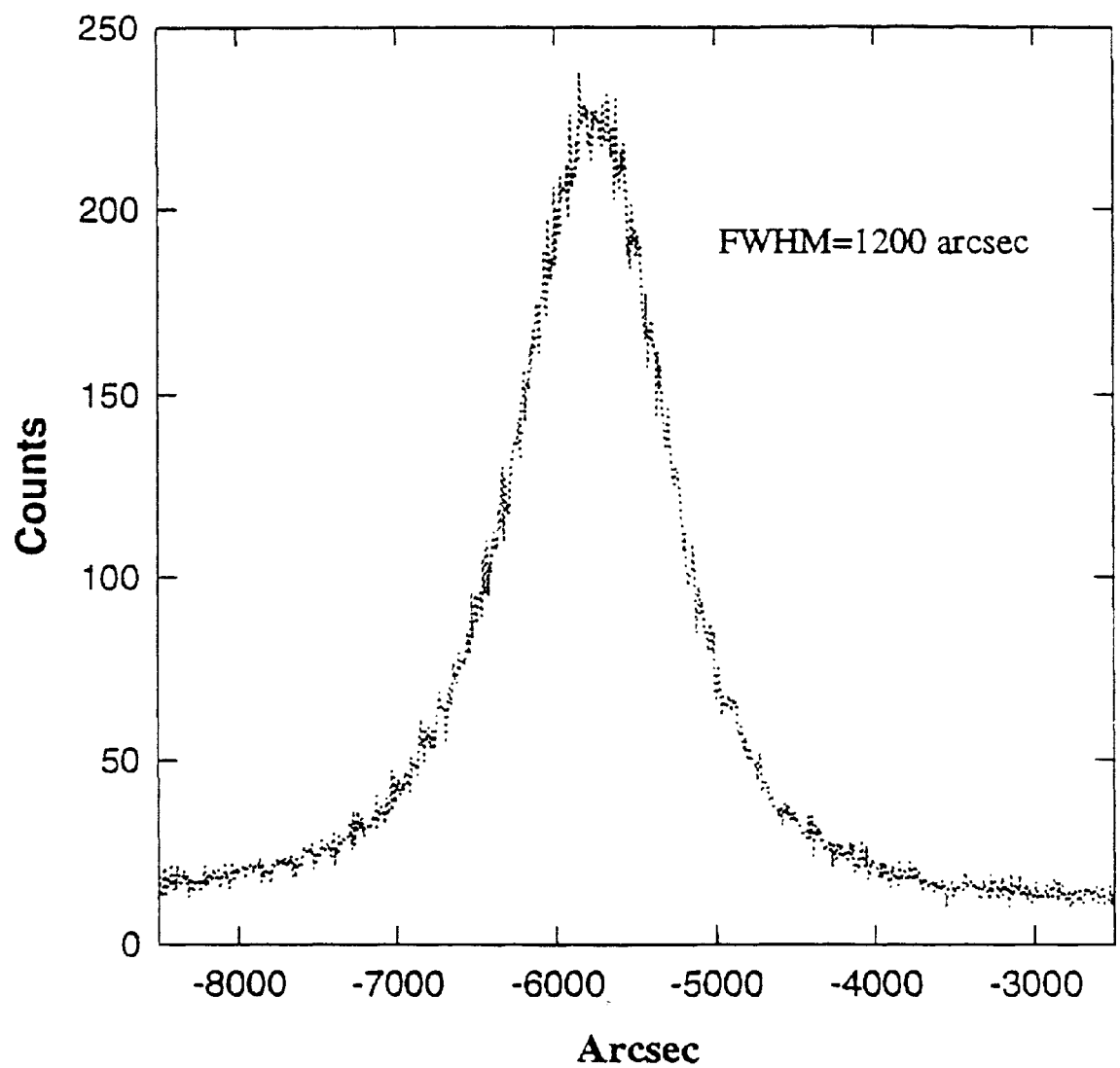
FIG. 2 is a double crystal rocking curve of the epitaxial layer.

The results of the epitaxial growth (the ratio of nitrogen and gallium is 1:1) are shown in FIGS. 2~5. As shown in FIG. 2, the epitaxial layer has a good crystallization and its full width at half maximum (FWHM) is 1200 arcsec.

Figure 3:
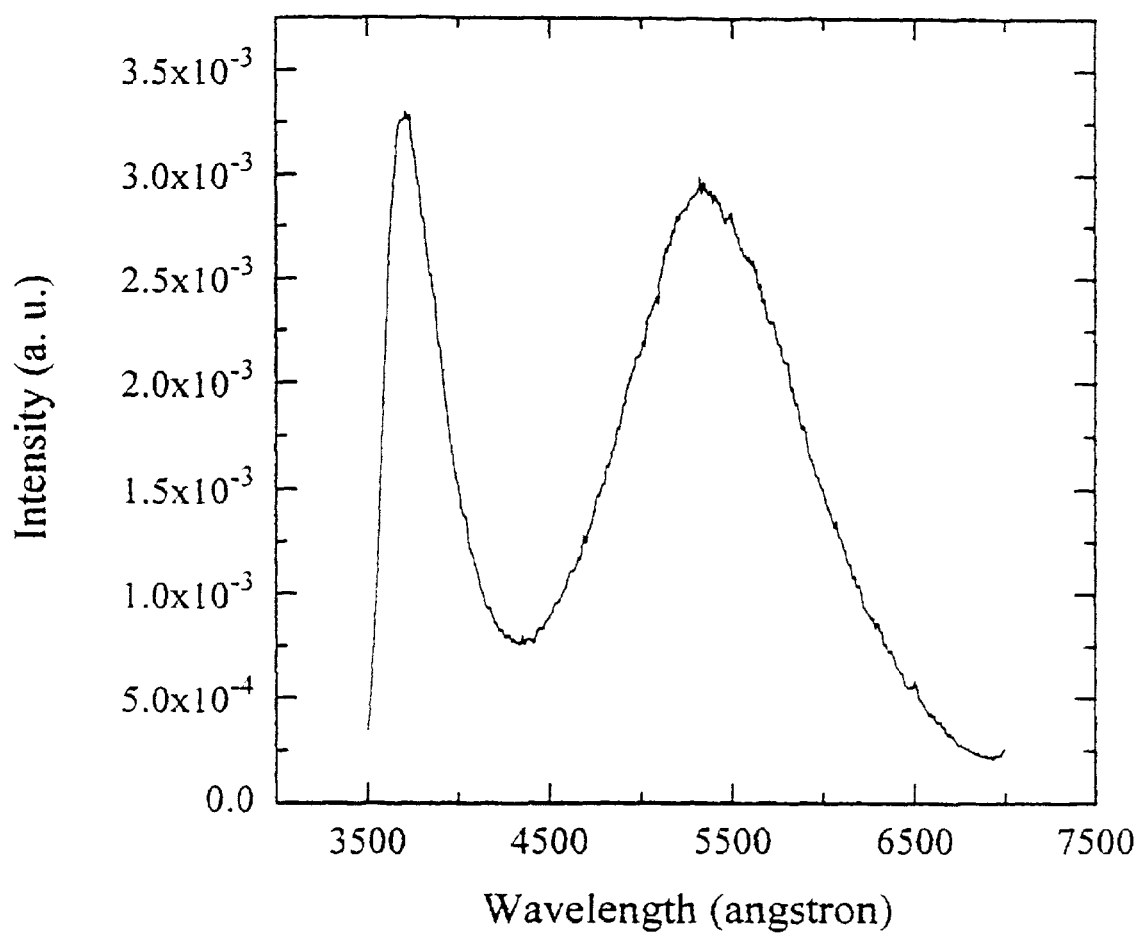
FIG. 3 is a photoluminescent measurement of the gallium nitride epitaxy.
Figure 4A:
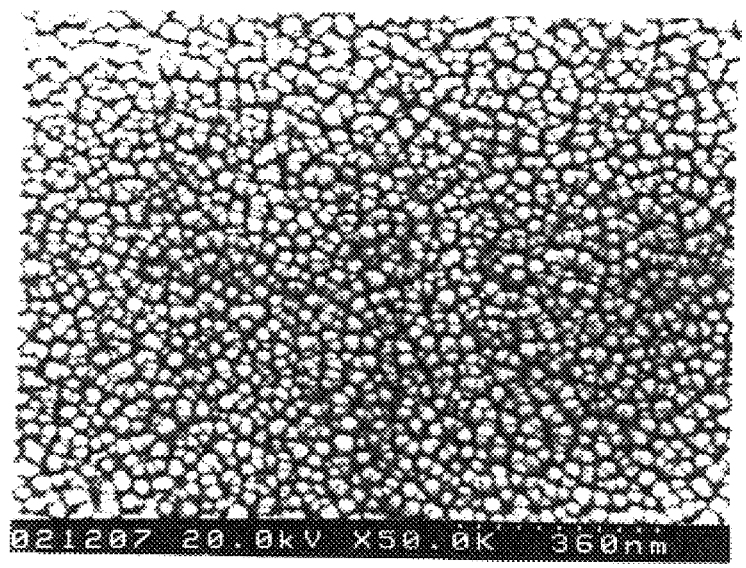
FIGS. 4a, 4b, 4c, 4d show the surface structure and the thickness of the epitaxy observed by a scanning electron microscope.
Figure 4B:
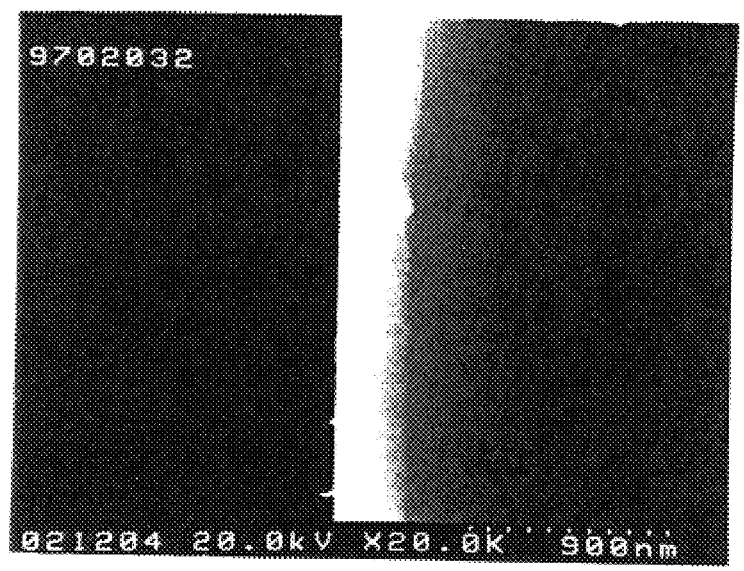
Figure 4C:
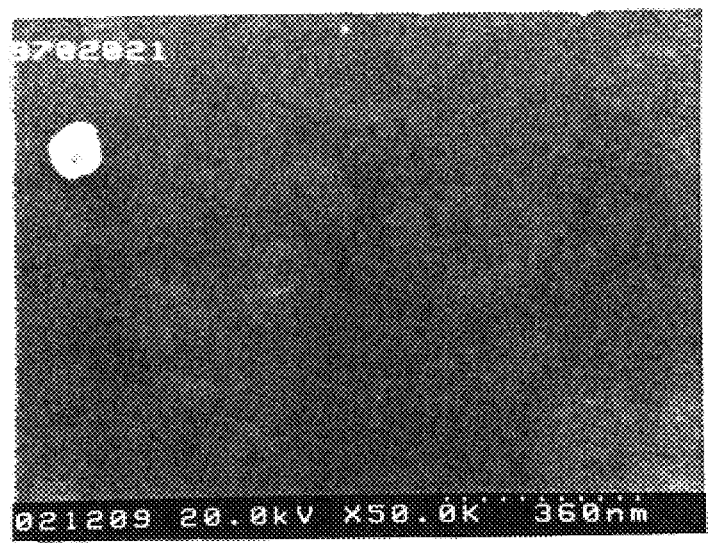
Figure 4D:
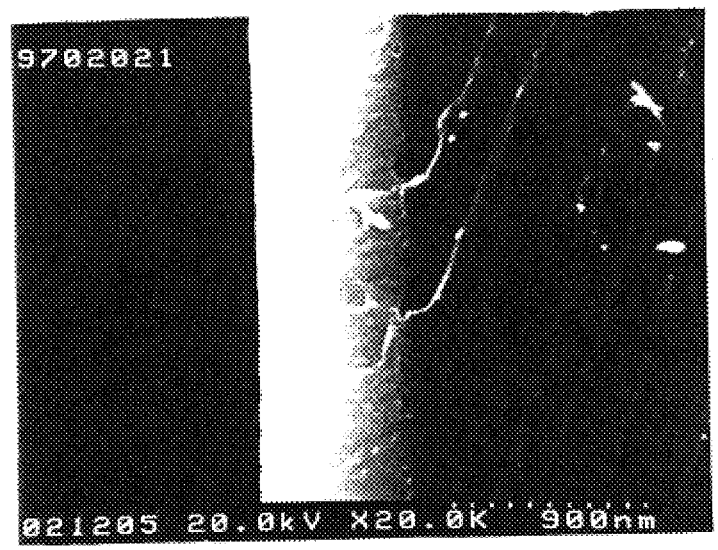

Please refer to FIG. 3 showing a photoluminescent measurement of the gallium nitride epitaxy. The excited light source is a He-Cd laser. In FIG. 3, there are two peaks 3700 Å and 5300 Å, where 5300 Å is a signal caused by the defects and 3700 Å specifies a fluorescent spectrum of the gallium nitride epitaxy.

FIGS. 4a~4d show the surface structure and the thickness of the epitaxy observed by a scanning electron microscope. If the epitaxial growth is performed at 600° C. (lower temperature), the surface of gallium nitride becomes granular and the particle size is tens of nanometers in diameter. When the temperature is elevated to exceed 900° C., the surface of gallium nitride will be relatively smooth which is similar to that formed by the conventional organometallic vapor-phase epitaxy.

Figure 5:
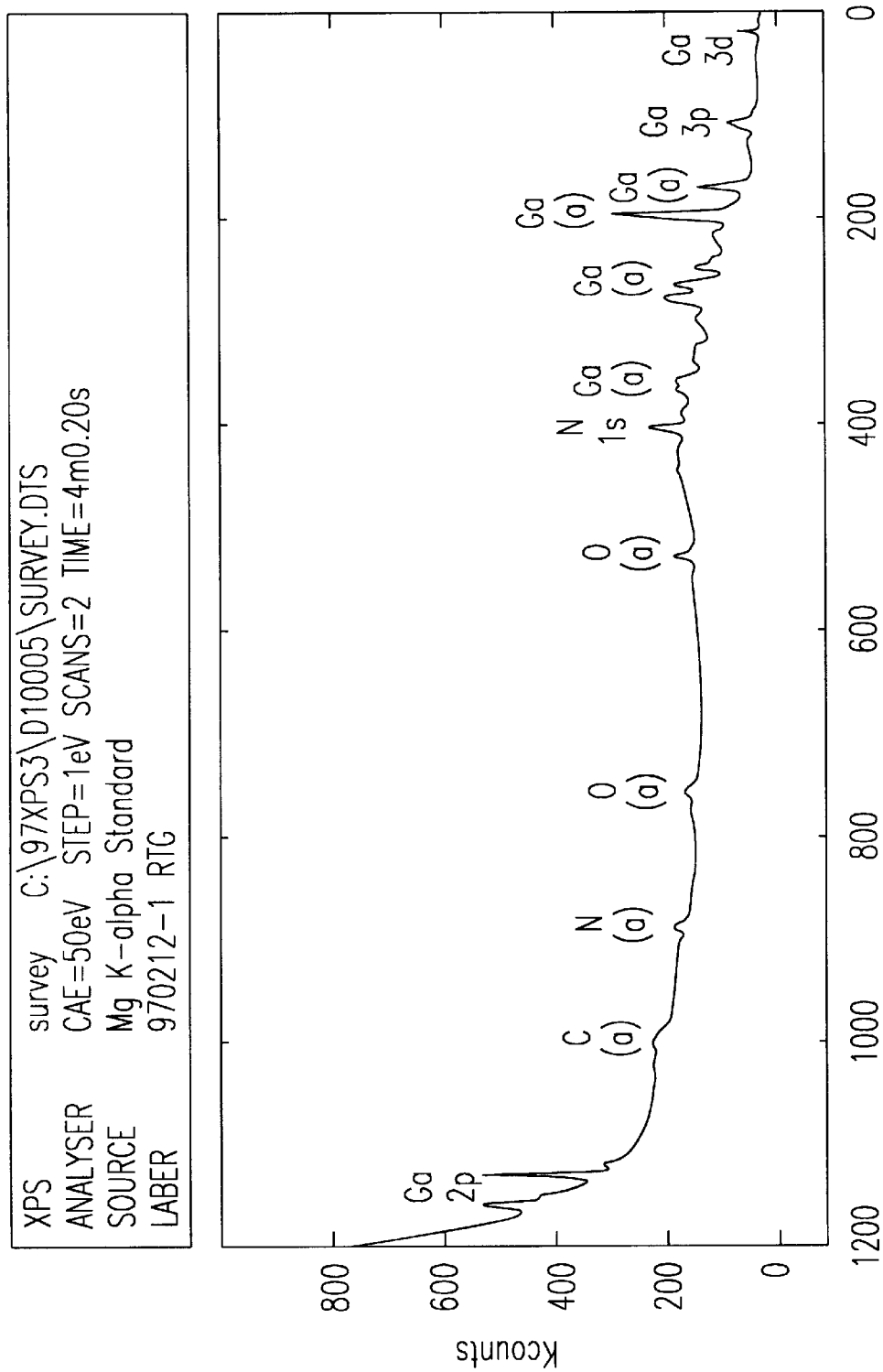
FIG. 5 shows an Auger electron spectrum of the epitaxy components.

FIG. 5 shows an Auger electron spectrum of the epitaxy components. From the measured binding energy, the surface material of the epitaxial layer is made of gallium, carbon, nitrogen and oxygen in which the appearance of carbon and oxygen results from the surface adherence and the background concentration of platform.

The advantage of the present invention is that the plasma of the first reactant (VA elements) is generated by the high radiation frequency plasma generator but not utilizing the heat energy so that it is suitable for different kinds of VA elements.

The present invention provides a organometallic vapor phase epitaxial system to be applied to grow many matertials, especially the growth of IIIA-VA compound semiconductors. This new designed system is a horizontal reactor, wherein the high radiation frequency plasma generator, the medium radium radiation frequency heater, and the wafer transferred region are combined in a horizontal arrangement. The epitaxial system according to the present invention has a very simple design and a low cost. In addition, this system can also provide a stable epitaxial growth.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An epitaxial system comprising:
   a first reaction region for providing a plasma of a first reactant;
   a second reaction region for epitaxially reacting said plasma of said first reactant with a second reactant on a wafer; and
   a guiding medium disposed between said first reaction region and said second reaction region for passing therethrough said second reactant and said first reactant plasma to said second reaction region, wherein said first reaction region, said second reaction region, and said guiding medium are horizontally arranged together.

2. An epitaxial system according to claim 1 wherein said first reaction region includes a high radiation frequency plasma generator.

3. An epitaxial system according to claim 1 wherein said first reactant is a substance containing VA elements.

4. An epitaxial system according to claim 3 wherein said first reactant is one selected from a group consisting of ammonia, nitrogen, arsenic, arsine ($AsH_3$), phosphorus, phosphorus trihydride ($PH_3$) and a mixture thereof.

5. An epitaxial system according to claim 1 wherein said second reaction region includes a medium radiation frequency heater for controlling a temperature of said wafer ranged from room temperature to 1200° C.

6. An epitaxial system according to claim 1 wherein said second reactant is one selected from a group consisting of IIIA organometallic compounds.

7. An epitaxial system according to claim 6 wherein said second reactant is a gallium-containing compound.

8. An epitaxial system according to claim 1 wherein said guiding medium is a multi-hole tube.

9. An epitaxial system according to claim 1 further comprising a gas container to provide a carrier gas for carring said first reactant and said second reactant.

10. An epitaxial system according to claim 9 further comprising a gas flow controller for controlling flow rates of said first reactant, said second reactant, and said carrier gas.

11. An epitaxial system according to claim 10 further comprising an electronic pressure controller to control said gas flow controller.

12. An epitaxial system according to claim 11 further comprising a vacuum pumping system controlled by said electronic pressure controller for adjusting a pressure of said epitaxial system.

* * * * *